United States Patent
Ide et al.

(10) Patent No.: US 8,222,769 B2
(45) Date of Patent: Jul. 17, 2012

(54) MAGNETIC COUPLING TYPE ISOLATOR

(75) Inventors: Yosuke Ide, Niigata-ken (JP);
Masamichi Saito, Niigata-ken (JP);
Akira Takahashi, Niigata-ken (JP);
Tsuyoshi Nojima, Niigata-ken (JP);
Yoshihiro Nishiyama, Niigata-ken (JP);
Hidekazu Kobayashi, Niigata-ken (JP);
Kenji Ichinohe, Niigata-ken (JP); Naoki Sakatsume, Niigata-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 322 days.

(21) Appl. No.: 12/754,529

(22) Filed: Apr. 5, 2010

(65) Prior Publication Data
US 2010/0270866 A1 Oct. 28, 2010

(30) Foreign Application Priority Data
Apr. 28, 2009 (JP) ................................. 2009-109609

(51) Int. Cl.
*H04B 3/00* (2006.01)
*H01F 27/30* (2006.01)
*H01L 29/82* (2006.01)

(52) U.S. Cl. ........................... 307/91; 336/206; 257/422

(58) Field of Classification Search ..................... 307/91;
324/300; 336/206; 257/422, 659
See application file for complete search history.

(56) References Cited

U.S. PATENT DOCUMENTS

| | | | |
|---|---|---|---|
| 6,376,933 B1 * | 4/2002 | Goetz et al. ..................... 307/91 |
| 7,193,832 B2 * | 3/2007 | Hasegawa et al. ............. 361/139 |
| 7,948,349 B2 * | 5/2011 | Haratani et al. ............... 336/221 |
| 7,952,345 B2 * | 5/2011 | Myers et al. ................ 324/117 R |
| 2010/0270865 A1 * | 10/2010 | Ide et al. ........................ 307/91 |

FOREIGN PATENT DOCUMENTS

| | | |
|---|---|---|
| JP | 2000-516714 | 12/2000 |
| JP | 2003-526083 | 9/2003 |

* cited by examiner

*Primary Examiner* — Michael Rutland Wallis
(74) *Attorney, Agent, or Firm* — Beyer Law Group LLP

(57) ABSTRACT

A magnetic coupling type isolator includes: a magnetic field generator for generating an external magnetic field by an input signal; a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view; first and second shield films overlapped with the magnetic field generator and the magnetoresistive element as seen in a top plan view; and a third shield film disposed to surround the magnetoresistive element.

10 Claims, 12 Drawing Sheets

MAGNETIC COUPLING TYPE ISOLATOR

CROSS REFERENCE TO RELATED APPLICATION

The present invention contains subject matter related to Japanese Patent Application JP 2009-109609 filed in the Japanese Patent Office on Apr. 28, 2009, the entire contents of which being incorporated herein by reference.

BACKGROUND

1. Technical Field

The present invention relates to a magnetic coupling type isolator having a magnetic field generator and a magnetoresistive element such as a TMR (tunneling magnetoresistance) element, a CIP-GMR (current-in-plane giant magnetoresistance) element, and CPP-GMR (current perpendicular-to-the-plane) element.

2. Related Art

In an electronic circuit, for example, if a portion where a large current flows and a portion where a signal is transmitted are approximated to each other, the portion where a large current flows may influence signal transmission. For this reason, a circuit element for electrically separating the portion where a large current flows from the portion where a signal transmission is performed is necessary. Such a circuit element includes an optical isolator using a photo-coupler. The optical isolator includes a combination of a light sensing element and a light emitting element and has a function of transmitting signals by converting electricity into light and vice versa.

Meanwhile, a magnetic coupling type isolator capable of providing further miniaturization and lower power consumption compared to the optical isolator has been developed. For example, PCT Japanese Translation Patent Publication Nos. 2000-516714 and 2003-526083 disclose a magnetic coupling type isolator having a magnetic field generator for converting an input signal into a magnetic field and a magnetoresistive element for detecting the external magnetic field generated by the magnetic field generator and converting it into the electric signal. Here, the magnetoresistive element includes a Hall element, an AMR (anisotropic magnetoresistive) element, or a GMR (giant magnetoresistive) element.

In the magnetic coupling type isolators disclosed in PCT Japanese Translation Patent Publication Nos. 2000-516714 and 2003-526083, a shield capability for unnecessary magnetic fields from an external environment is obtained by providing a shield film in an upper portion of a coil where the magnetic fields are generated. This shield film also functions as a concentrator of the magnetic fields applied to the magnetoresistive element from the coil.

However, in the magnetic coupling type isolators disclosed in PCT Japanese Translation Patent Publication Nos. 2000-516714 and 2003-526083, the shield film is disposed only in the coil. Therefore, it may be impossible to obtain a sufficient tolerance to the external magnetic fields or an EMS (electro magnetic susceptibility).

SUMMARY

An advantage of some aspects of the invention is to provide a magnetic coupling type isolator enabled to obtain a sufficient tolerance to an external magnetic field or an EMS.

According to an aspect of the invention, there is provided a magnetic coupling type isolator including: a magnetic field generator for generating an external magnetic field by an input signal; a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view; first and second shield films overlapped with the magnetic field generator and the magnetoresistive element as seen in a top plan view; and a third shield film disposed to surround the magnetoresistive element.

In this configuration, since the first and second shield films are disposed to be overlapped with the magnetic field generator and the magnetoresistive element as seen in a top plan view, and the third shield film is disposed to surround the magnetoresistive element, it is possible to obtain a sufficient tolerance to an external magnetic field or an EMS.

In the magnetic coupling type isolator according to an embodiment of the present invention, it is preferable that the third shield film has a ring shape as seen in a top plan view and a width of 10 to 300 μm.

In the magnetic coupling type isolator according to an embodiment of the present invention, it is preferable that the first and/or second shield films have a circular or elliptical shape as seen in a top plan view.

In the magnetic coupling type isolator according to an embodiment of the present invention, it is preferable that the first and/or second shield films have an n-polygonal shape (n=4 to ∞) as seen in a plan view, of which corner portions have a curvature ten or more times of a film thickness.

In the magnetic coupling type isolator according to an embodiment of the present invention, it is preferable that the first and/or second shield films are disposed in an inner side with respect to an outer circumference of the third shield film.

In the magnetic coupling type isolator according to an embodiment of the present invention, it is preferable that the first and/or second shield films are formed to have an area larger than a square shape of 100 μm×100 μm and smaller than a square shape of 600 μm×600 μm.

In the magnetic coupling type isolator according to an embodiment of the present invention, it is preferable that the magnetic field generator includes first and second magnetic field generators by which the external magnetic field is generated in an opposite direction, wherein the magnetoresistive element includes a magnetoresistive element disposed to face the first magnetic field generator and a magnetoresistive element disposed to face the second magnetic field generator are included in the same layer, and wherein the magnetoresistive element disposed to face the first magnetic field generator and the magnetoresistive element disposed to face the second magnetic field generator constitute a bridge circuit.

In the magnetic coupling type isolator according to an embodiment of the present invention, it is preferable that the first shield film has a function of enhancing the magnetic field applied from the magnetic field generator to the bridge circuit.

In the magnetic coupling type isolator according to an embodiment of the present invention, it is preferable that the first, second, and/or third shield films are made of a high magnetic permeability material.

In the magnetic coupling type isolator according to an embodiment of the present invention, it is preferable that the first, second, and/or third shield films are point-symmetrical as seen in a top plan view, and the symmetrical centers of the first, second, and/or third shield films match with one another.

A magnetic coupling type isolator according to the present invention includes a magnetic field generator for generating an external magnetic field by an input signal, a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view, first and second shield films overlapped with the magnetic field generator and the magnetoresistive element as seen in a top plan view, and a third shield film disposed to surround the magnetoresistive element. Accordingly, it is possible to obtain a sufficient tolerance to an external magnetic field or an EMS.

DESCRIPTION OF EXEMPLARY EMBODIMENTS

Hereinafter, embodiments of the invention will be described in detail with reference to the accompanying drawings.

Embodiment 1

Figure 1:
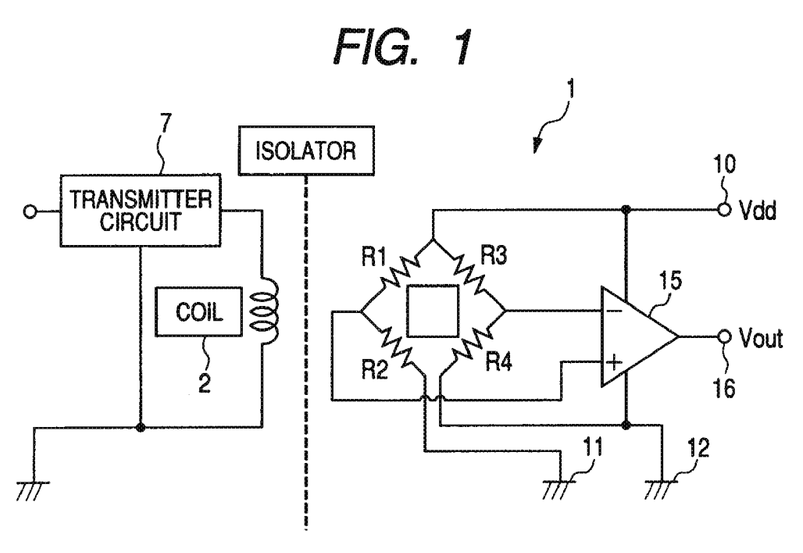
FIG. 1 shows a circuit diagram of an entire configuration of a magnetic coupling type isolator according to an embodiment of the invention.
Figure 2:
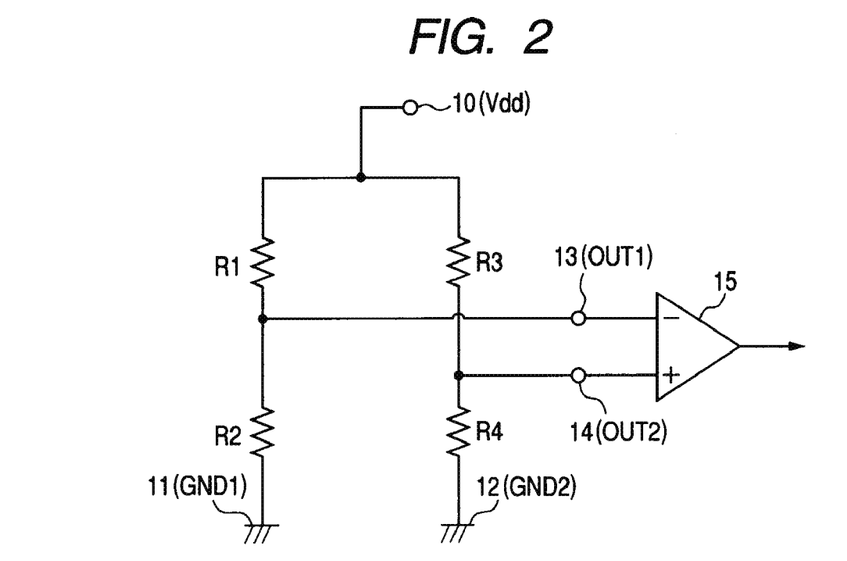
FIG. 2 shows a circuit diagram of a bridge circuit including magnetoresistive elements R1 to R4.
Figure 3:
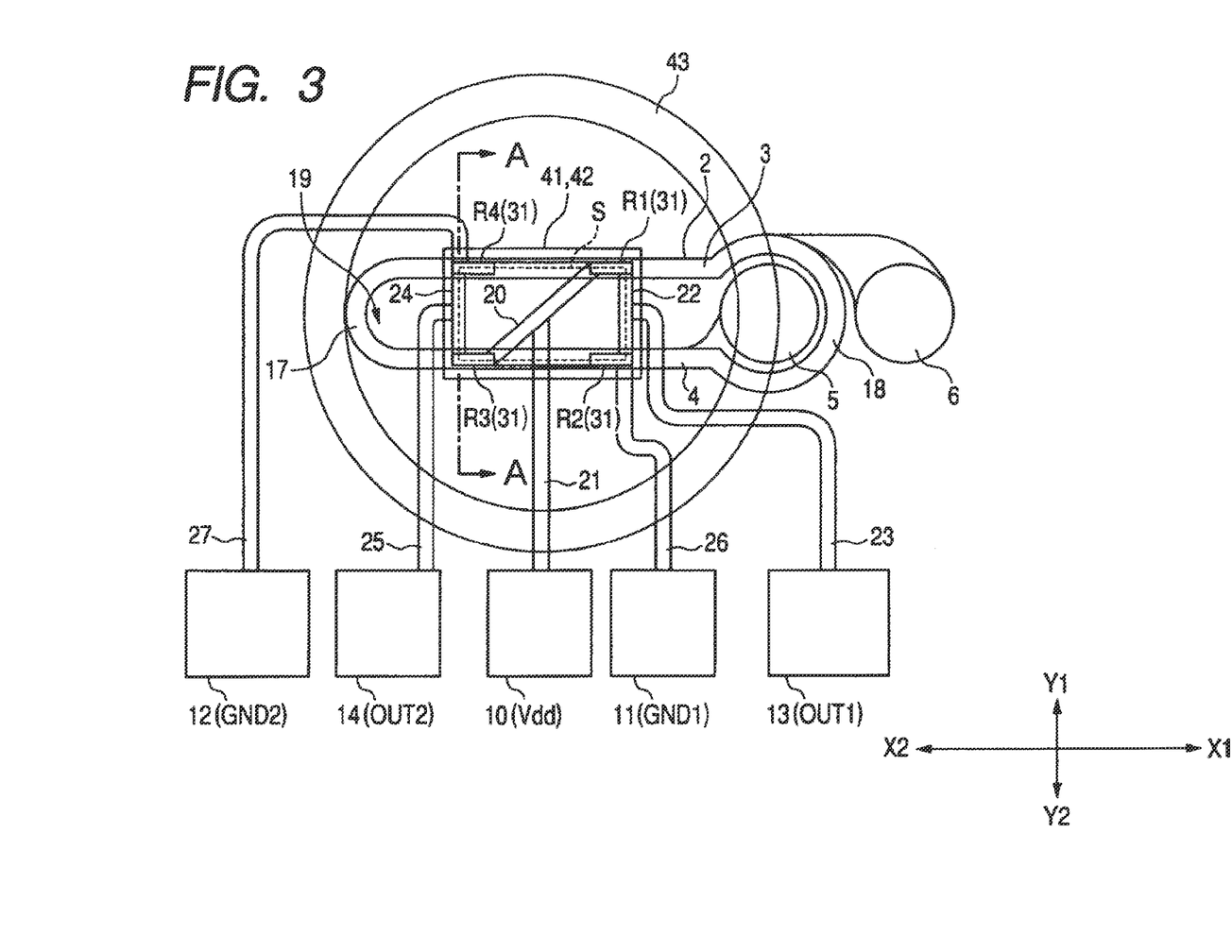
FIG. 3 shows a partial plan diagram of a magnetic coupling type isolator according to an embodiment of the invention.
Figure 4:
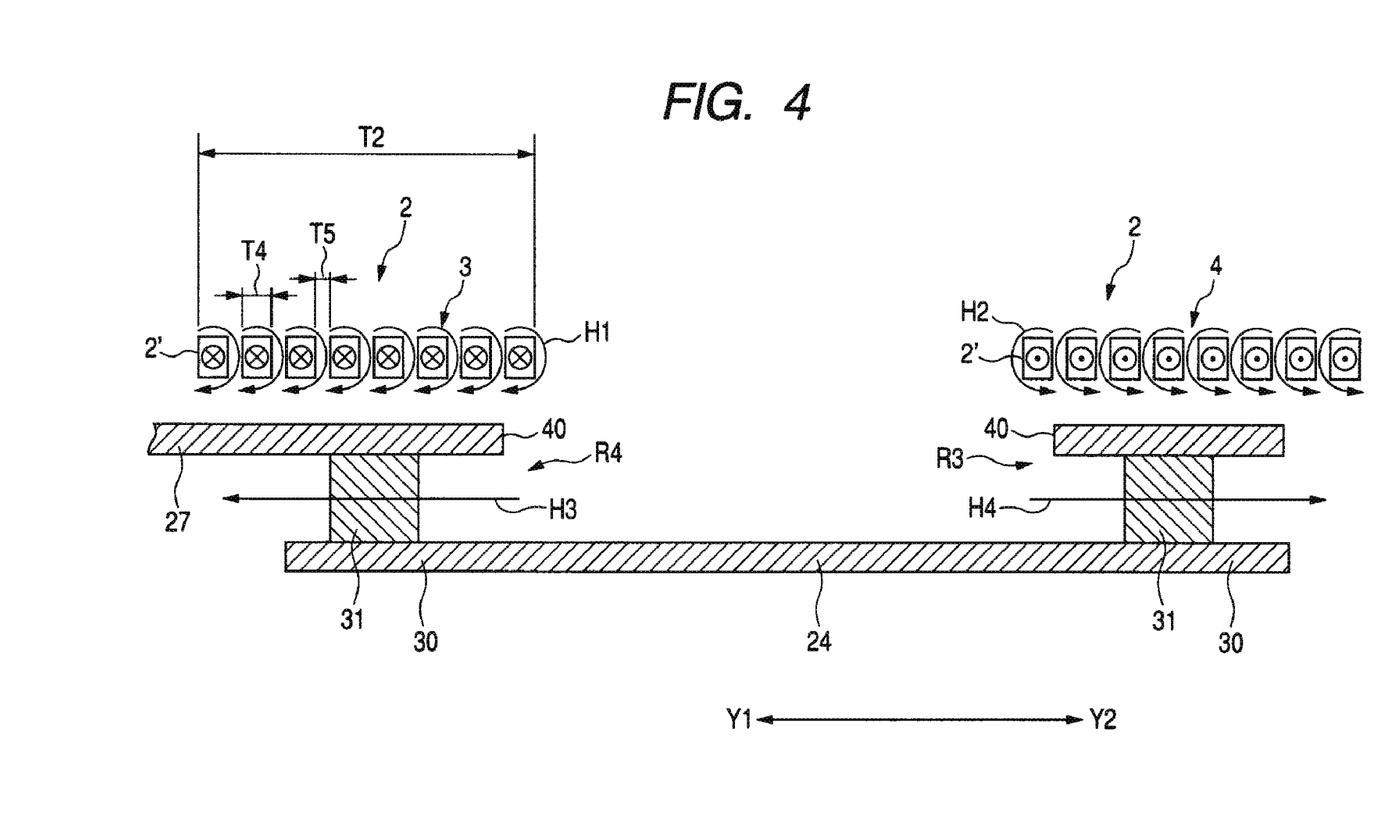
FIG. 4 shows a partially cross-sectional diagram viewed from an arrow direction and cut away in a thickness direction along a line A-A of FIG. 3.

FIG. 1 is a circuit diagram illustrating an entire configuration of a magnetic coupling type isolator (or magnetic coupler) according to an embodiment of the invention. FIG. 2 is a circuit diagram illustrating a bridge circuit including magnetoresistive elements R1 to R4. FIG. 3 is a partial plan diagram illustrating a magnetic coupling type isolator according to an embodiment of the invention. FIG. 4 is a partially cross-sectional diagram viewed from an arrow direction and cut away in a thickness direction along a line A-A of FIG. 3. In addition, while the insulation layer is not shown, and only the inner and outer edges of the coil 2 are shown in FIG. 3, the magnetoresistive elements R1 to R4 underlying the coil 2 are shown by transparency.

As shown in FIG. 1, the magnetic coupling type isolator 1 includes a coil 2 as a magnetic field generator for generating an external magnetic field by the input signal and magnetoresistive elements R1 to R4 for detecting the external magnetic field and converting it into an electric signal. While the coil 2 and each of the magnetoresistive elements R1 to R4 are electrically insulated by an insulation layer (not shown), they are spaced at an interval capable of obtaining a magnetic coupling. In other words, the coil 2 and the magnetoresistive elements R1 to R4 are electrically insulated, spaced at an interval capable of obtaining a magnetic coupling, and overlapped with each other as seen in a top plan view.

In FIG. 1, a signal processing circuit (IC) such as a differential amplifier 15 or an external output terminal 16 is included in the magnetic coupling type isolator 1. However, the magnetic coupling type isolator 1 may include a coil 2, magnetoresistive elements R1 to R4, and terminals 10 to 14 shown in FIG. 3 without the signal processing circuit (IC). In this case, it is necessary to electrically connect the magnetic coupling type isolator 1 to the signal processing circuit (IC) of the electronic device side.

As shown in FIG. 3, the coil 2 includes a first magnetic field generator 3 and a second magnetic field generator 4 extending along a direction X1-X2. The first and second magnetic field generators 3 and 4 face each other with an interval along a direction Y1-Y2. The first and second magnetic field generators 3 and 4 are connected to each other by interconnections 17 and 18. The interconnections 17 and 18 are curved in shape, but not limited thereto. There is a space section 19 surrounded by the first magnetic field generator 3, the second magnetic field generator 4, and interconnections 17 and 18.

As shown in FIG. 4, the coil 2 is formed by winding a plurality of coil pieces 2', having a width T4, spaced at a predetermined interval T5. Therefore, as shown in FIG. 4, the first and second magnetic field generators 3 and 4 include a plurality of coil pieces 2' arranged side by side along a direction Y1-Y2.

Two electrode pads 5 and 6 are connected to the coil 2. The electrode pads 5 and 6 have a circular shape, but are not limited thereto. In addition, the coil 2 is connected to the transmitter circuit 7 through the electrode pads 5 and 6 as shown in FIG. 1. When the electric current flows based on the input signal from the transmitter circuit 7, an external magnetic field is generated from the coil 2. As shown in FIG. 4, the current flowing through the coil piece 2' of the first magnetic field generator 3 is anti-parallel to the current flowing through the coil piece 2' of the second magnetic field generator 4. Therefore, Tte external magnetic field H1 generated by the coil piece 2' of the first magnetic field generator 3 is directed adversely to the external magnetic field H2 generated by the coil piece 2' of the second magnetic field generator 4. As shown in FIGS. 3 and 4, under (or over) the first and second magnetic field generators 3 and 4, the magnetoresistive elements R1 to R4 are arranged to face each other by interposing an insulation layer (not shown). The external magnetic field H3 applied by the first magnetic field generator 3 to the first and fourth magnetoresistive elements R1 and R4 arranged to face the first magnetic field generator 3 is anti-parallel to the external magnetic field H4 applied by the second magnetic field generator 4 to the second and third magnetoresistive elements R2 and R3 arranged to face the second magnetic field generator 4.

As shown in FIG. 2, the first magnetoresistive element R1 is connected in series to the second magnetoresistive element R2, and the third magnetoresistive element R3 is connected in series to the fourth magnetoresistive element R4. In addition, the first and third magnetoresistive elements R1 and R3 are connected to the input terminal (input pad) 10. According to an embodiment of the invention, the number of input terminals 10 is one. In addition, the second and fourth magnetoresistive elements R2 and R4 are connected to ground terminals (or ground pads) 11 and 12, respectively. Therefore, according to an embodiment of the invention, the number of ground terminals 11 and 12 is two.

As shown in FIG. 2, the first output terminal 13 (or first output pad OUT1) is connected between the first and second magnetoresistive elements R1 and R2. The second output terminal 14 (or second output pad OUT2) is connected between the third and fourth magnetoresistive elements R3 and R4. In addition, as shown in FIGS. 1 and 2, the output sides of the first and second output terminals 13 and 14 are connected to the differential amplifier 15. As shown in FIG. 1, the output side of the differential amplifier 15 is connected to the external output terminal 16.

As shown in FIG. 3, the first magnetoresistive element R1 arranged to face the first magnetic field generator 3 of the coil 2 is disposed in the X1 side, and the fourth magnetoresistive element R4 is disposed in the X2 side. In addition, the second magnetoresistive element R2 arranged to face the second magnetic field generator 4 of the coil 2 is disposed in the X1 side, and the third magnetoresistive element R3 is disposed in the X2 side.

As shown in FIG. 3, the first wiring pattern 20 is connected between the first and third magnetoresistive elements R1 and R3. The first wiring pattern 20 is disposed within a boxed area S rectilinearly enclosed by each element R1 to R4 as seen in a top plan view. The first wiring pattern 20 is slanted against the directions X1-X2 and Y1-Y2. The second wiring pattern 21 is branched from the first wiring pattern 20. The second wiring pattern 21 extends from the inner side of the boxed area S to the outer side of the boxed area S and is connected to the input terminal 10.

As shown in FIG. 3, the third wiring pattern 22 is connected between the first and second magnetoresistive elements R1 and R2. The third wiring pattern 22 extends along a direction Y1-Y2. Furthermore, the fourth wiring pattern 23 is branched from the third wiring pattern 22 to the outer direction of the boxed area S. The fourth wiring pattern 23 is connected to the first output terminal 13.

As shown in FIG. 3, the fifth wiring pattern 24 is connected between the third and fourth magnetoresistive elements R3 and R4. The fifth wiring pattern 24 extends along a direction Y1-Y2. Furthermore, the sixth wiring pattern 25 is branched from the fifth wiring pattern 24 to the outer direction of the boxed area S. The sixth wiring pattern 25 is connected to the second output terminal 14.

Furthermore, as shown in FIG. 3, the seventh wiring pattern 26 is connected between the second magnetoresistive element R2 and the first ground terminal 11. In addition, the eighth wiring pattern 27 is connected between the fourth magnetoresistive element R4 and the second ground terminal 12.

As shown in FIG. 3, the terminals 10 to 14 are arranged in a line with a predetermined interval along a direction X1-X2. Therefore, a wiring (i.e., electrical connection) to the signal processing circuit (IC) side can be simplified. In the center of the terminals 10 to 14, the input terminal 10 is solely disposed. Such an arrangement allows the wiring patterns to be drawn so as not to overlap with one another as seen in a top plan view.

However, the shapes of wiring patterns are not limited to those shown in FIG. 3. The wiring patterns may be overlapped with one another as seen in a top plan view. Instead of those shown in FIG. 3, the ground terminal may be placed in the position of the input terminal 10, and the input terminal may be placed in the position of the ground terminal 11, 12. In this case, the number of ground terminals is one, and the number of input terminals is two.

As shown in FIG. 3, the upper shield film (or first shield film) 41 and the lower shield film (or second shield film) 42 are overlapped with the coil 2 functioning as the magnetic field generator and the magnetoresistive elements R1 to R4 as seen in a top plan view. In addition, the middle shield (or third shield film) 43 is arranged to surround the magnetoresistive elements R1 to R4.

Figure 5:
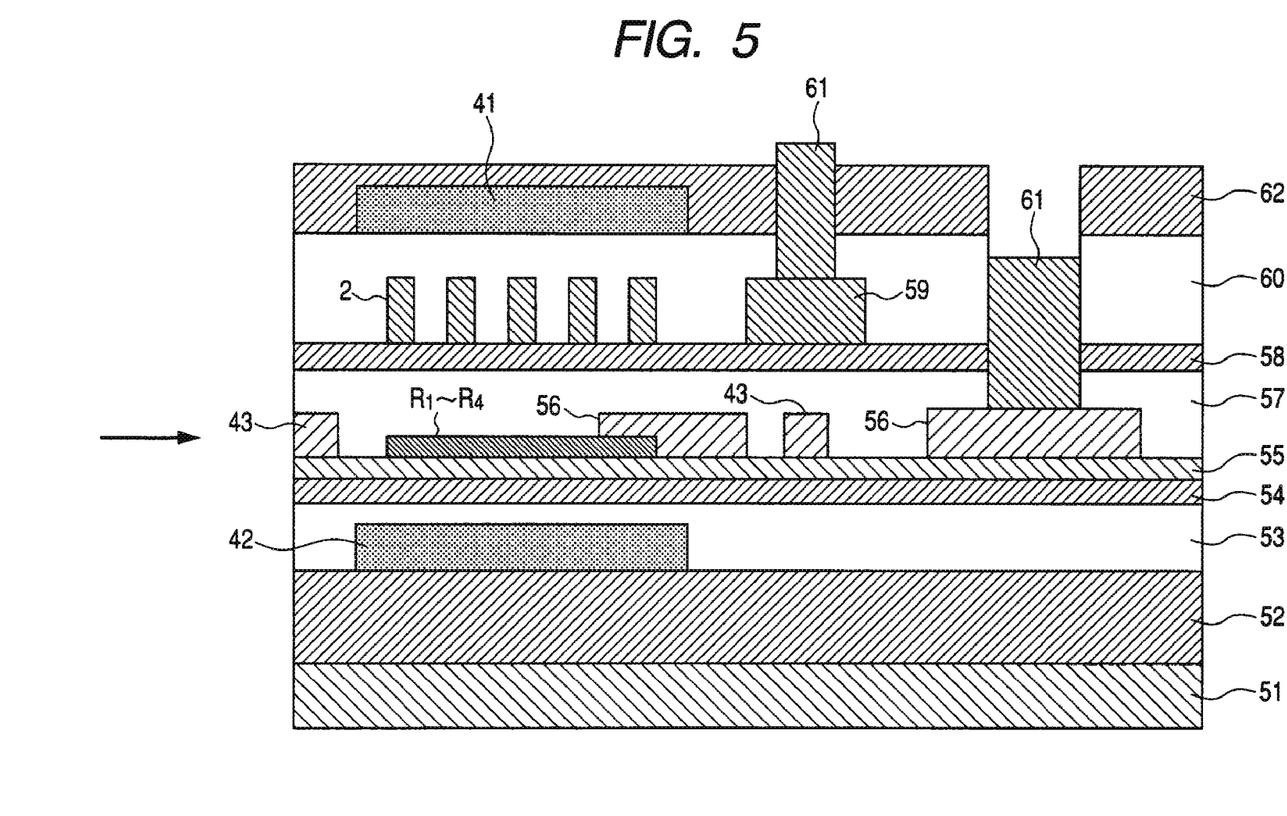
FIG. 5 shows a partially cross-sectional diagram of a magnetic coupling type isolator according to an embodiment of the invention.

FIG. 5 is a partially cross-sectional diagram illustrating a magnetic coupling type isolator according to an embodiment of the invention. In the magnetic coupling type isolator shown in FIG. 5, the silicon oxide film 52 functioning as the insulation layer is formed on the silicon substrate 51. The silicon oxide film 52 may include a silicon oxide film formed by thermal oxidation or a silicon oxide film formed by CVD (chemical vapor deposition).

A lower shield film 42 is formed under an area of the coil 2, i.e., in a thickness direction, (in a position overlapped with the coil 2 and the magnetoresistive elements R1 to R4 as seen in a top plan view), at a predetermined position on the silicon oxide film 52. A material of the lower shield film 42 includes a high magnetic permeability material such as an amorphous magnetic material, a permalloy-based magnetic material, or an iron-based microcrystalline material. The thickness of the lower shield film 42 is preferably set to 0.5 to 10 µm considering film stress. The lower shield film 42 may be formed by photolithography and etching after the aforementioned material is formed. Alternatively, the lower shield film 42 may be formed by photolithography and plating after a base material is formed.

On the silicon oxide film 52 where the lower shield film 42 is provided, a polyimide layer 53 as an insulation layer is formed. The polyimide layer 53 may be formed by coating a polyimide material and curing it.

On the polyimide layer 53, the silicon oxide film 54 and the aluminum oxide film 55 are sequentially formed. The silicon oxide film 54 and the aluminum oxide film 55 may be formed, for example, by sputtering or the like.

On the aluminum oxide film 55, the magnetoresistive elements R1 to R4 are formed. Each of the magnetoresistive elements R1 to R4 has the same layer configuration. Each of the magnetoresistive elements R1 to R4 is formed, for example, using the structure shown in FIG. 6.

Figure 6:
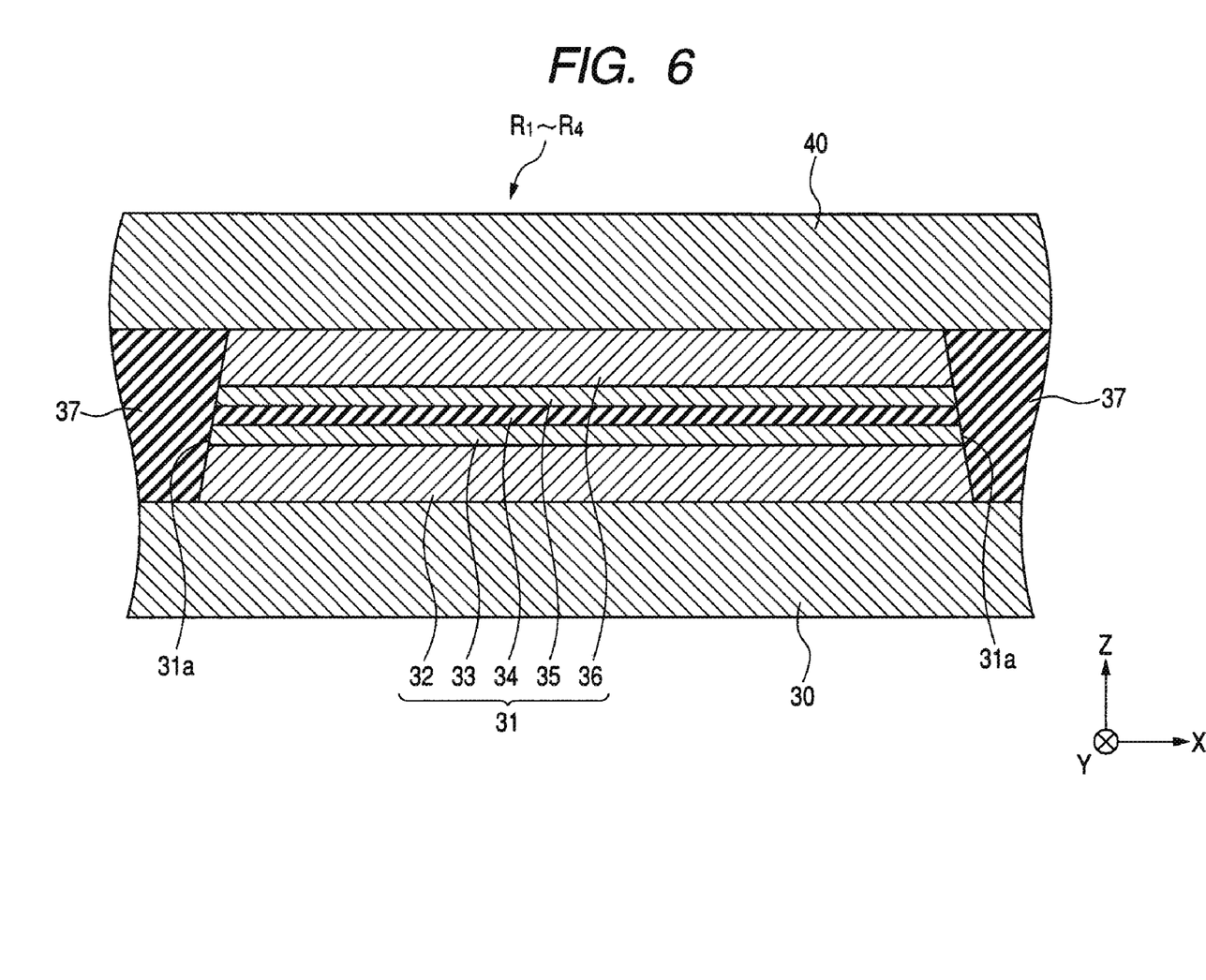
FIG. 6 shows a partially cross-sectional diagram of a TMR element included in a magnetic coupling type isolator according to an embodiment of the invention.

The reference numeral 30 shown in FIG. 6 is a lower electrode layer. A multilayer film 31 is provided on the lower electrode layer 30. The multilayer film 31 is formed by sequentially stacking an antiferromagnetic layer 32, a permanent magnetic layer 33, an insulation barrier layer 34, a free magnetic layer 35, and a protection layer 36 from the bottom. The multilayer film 31 may be formed by sequentially stacking a free magnetic layer 35, an insulation barrier layer 34, a permanent magnetic layer 33 and an antiferromagnetic layer 32 from the bottom.

The antiferromagnetic layer 32 is formed of, for example, an element a (including one or more elements selected from a group consisting of Pt, Pd, Ir, Rh, Ru, and Os) and an antiferromagnetic material containing Mn. A crystalline orientation layer for aligning crystalline orientations may be provided between the antiferromagnetic layer 32 and the lower electrode layer 30.

The magnetization of the permanent magnetic layer 33 is fixed in a Y-direction due to an exchange coupling magnetic field Hex generated in an interface with the antiferromagnetic layer 32. Here, "fixed magnetization" means that the magnetization does not change at least with respect to the external magnetic field applied from the coil 2 to the magnetoresistive elements R1 to R4. In FIG. 6, while the permanent magnetic layer 33 is a single-layered structure containing CoFe or the like, it may be a stacked structure, and particularly, a ferrimagnetic stack structure including a magnetic layer, a nonmagnetic intermediate layer, or a magnetic layer is preferable because the magnetization fixation force of the permanent magnetic layer 33 can increase.

The insulation barrier layer 34 is formed on the permanent magnetic layer 33. The insulation barrier layer 34 is formed of, for example, titanium oxide (Ti—O) or magnesium oxide (Mg—O). The free magnetic layer 35 is formed on the insulation barrier layer 34. While the free magnetic layer 35 is a single-layered structure in FIG. 6, it may be a magnetic stack structure. While the free magnetic layer 35 is a single-layered structure containing NiFe, it is preferably a stack structure containing NiFe. The protection layer 36 formed of a nonmagnetic metallic material such as Ta is formed on the free magnetic layer 35.

Both side end surfaces 31a and 31a of the direction X1-X2 (i.e., X-direction) of the multilayer film 31 are formed to be slanted such that the width of the X-direction is gradually narrowed from the bottom to the top. However, they need be not slanted but may be vertically erected.

As shown in FIG. 6, the insulation layer 37 is formed across the side end surfaces 31a and 31a on the lower electrode layer 30. The insulation layer 37 is formed on an existing insulation material such as Al2O3 or SiO2. Furthermore, the upper electrode layer 40 is formed on the insulation layer 37 and the multilayer film 31.

Next, an output of a bridge circuit for the external magnetic field will be described. For example, if the magnetization of the permanent magnetic layers 33 of each magnetoresistive element R1 to R4 are fixed in the Y1 direction, and the external magnetic fields H3 and H4 shown in FIG. 4 are applied to the magnetoresistive elements R1 to R4, the magnetization of the free magnetic layers 35 of the first and fourth magnetoresistive elements R1 and R4 is oriented to a direction Y1. Therefore, the electric resistance values of the first and fourth magnetoresistive elements R1 and R4 are reduced. Meanwhile, the magnetization of the second and third magnetoresistive elements R2 and R3 is orientated to a direction Y2. Therefore, the electric resistance values of the second and third magnetoresistive elements R2 and R3 increase. As a result, the midpoint electric potential between the first and second magnetoresistive elements R1 and R2 and the midpoint electric potential between third and fourth magnetoresistive elements R3 and R4 change, so that a differential output can be obtained. As described above, in the magnetic coupling type isolator 1, the electric signal can be transferred from the coil 2 via the magnetoresistive elements R1 to R4.

According to an embodiment of the invention, all the magnetoresistive elements R1 to R4 are formed in the same layer structure. Here, the "layer structure" includes the magnetization orientation of the permanent magnetic layer 33 as well as a stack sequence or a material. As shown in FIG. 3, the first and fourth magnetoresistive elements R1 and R4 are disposed to face the first magnetic field generator 3 of the coil 2, and the second and third magnetoresistive elements R2 and R3 are disposed to face the second magnetic field generator 4. By connecting wires as shown in FIG. 3, a bridge circuit is configured by the magnetoresistive elements R1 to R4. Since all the magnetoresistive elements R1 to R4 are formed in the same layer structure according to an embodiment of the invention, it is easy to match the resistance values or temperature characteristics of all the magnetoresistive elements R1 to R4, and it is possible appropriately and readily to form each of the magnetoresistive elements R1 to R4. In addition, as shown in FIG. 3, it is possible to simply and appropriately configure the bridge circuit by arranging the magnetoresistive elements R1 to R4 and the coil 2.

The magnetoresistive elements R1 to R4 according to an embodiment of the invention are TMR (tunneling magnetoresistive) elements. Therefore, the electrode layers 30 and 40 underlies and overlies the multilayer film 31. In addition, the electric current flows in a vertical direction with respect to the film surfaces of each layer of the multilayer film 31. Such a magnetoresistive element is referred to as a CPP (current perpendicular to the plane) type element. The CPP type element includes the CPP-GMR element in addition to the TMR element. In the CPP-GMR element, a nonmagnetic conductive layer such as Cu is used instead of the insulation barrier layer 34 shown in FIG. 6.

As shown in FIG. 4, the wiring pattern 24 is formed as a single body with the lower electrode layer 30. While the wiring pattern 24 may be formed separately from the lower electrode layer 30, the wiring pattern 24 and the lower electrode layer 30 are electrically connected to each other even in this case. The wiring pattern 27 is integrated with the upper electrode layer 40 as a single body. While the wiring pattern 27 may be formed separately from the upper electrode layer 40, the wiring pattern 27 and the upper electrode layer 40 are electrically connected to each other even in this case. As described above, since the TMR element includes the multilayer film 31 and the electrode layers 30 and 40 underlying and overlying the multilayer film 31, the wiring pattern connected to the electrode layers 30 and 40 is formed in a plurality of layers.

In the shape shown in FIG. 3, while the wiring patterns 20, 21, 26, 27 are formed in an upper layer, the wiring patterns 22, 23, 24, and 25 are formed in a lower layer, and vice versa.

Returning to FIG. 5, the electrode 56 is formed on the aluminum oxide film 55 so as to be electrically connected to the upper electrode layer 40 of the magnetoresistive elements R1 to R4. The electrode 56 is formed in an outer side with respect to the middle shield film so as to be electrically connected to the pad which will be described later. The electrode 56 may be formed by photolithography and etching after an electrode material is deposited.

The middle shield film 43 is formed on the aluminum oxide film 55 to surround the magnetoresistive elements R1 to R4. A material forming the middle shield film 43 may include a high magnetic permeability material such as an amorphous magnetic material, a permalloy-based magnetic material, or an iron-based microcrystalline material. The thickness of the middle shield film 43 is preferably set to 0.5 to 10 µm considering a film stress. The middle shield film 43 may be formed by photolithography and etching after the aforementioned material is deposited. Alternatively, the middle shield film 43 may be formed by photolithography and plating after a base material is deposited.

The polyimide layer 57 as an insulation layer is formed on the aluminum oxide film 55 including the magnetoresistive elements R1 to R4, the electrode 56, and the middle shield film 43. The polyimide layer 57 may be formed by coating a polyimide material and curing it.

The silicon oxide film 58 is formed on the polyimide layer 57. The silicon oxide film 58 may be formed, for example, by sputtering or the like.

The coil 2 is formed on the silicon oxide film 58. The coil 2 may be formed by photolithography and etching after the coil material is deposited. Alternatively, the coil 2 may be formed by photolithography and plating after a base material is deposited. In addition, the coil electrode 59 is formed on the silicon oxide film 58. The coil electrode 59 may be formed by photolithography and etching after the electrode material is deposited. Alternatively, the coil electrode 59 may be formed by photolithography and plating after a base material is deposited.

The polyimide layer 60 as the insulation layer is formed on the silicon oxide film 58 including the coil 2 and the coil electrode 59. The polyimide layer 60 may be formed by coating a polyimide material and curing it.

The upper shield film 41 is formed on the polyimide layer 60 at a predetermined position, i.e., in the thickness direction, over the coil 2 (the position overlapped with the coil 2 and the magnetoresistive elements R1 to R4 as seen in a top plan view). The upper shield film 41 may be formed of a high magnetic permeability material such as an amorphous magnetic material, a permalloy-based magnetic material, or an iron-based microcrystalline material. The thickness of the upper shield film 41 is preferably set to 0.5 to 10 µm considering a film stress. The upper shield film 41 may be formed by photolithography and etching after the aforementioned material is deposited. Alternatively, the upper shield film 41 may be formed by photolithography and plating after a base material is deposited.

The silicon oxide film 62 is formed as an overcoat layer on the polyimide layer 60 including the upper shield film 41. A contact hole is formed in the areas of the electrode 56 for the pad and the coil electrode 59 of the silicon oxide film 62, the polyimide layers 57 and 60, and the silicon oxide film 58, and the pad 61 is formed within the contact hole. As a result, the pad 61 and the coil electrode 59 are electrically connected to each other, and the pad 61 and the electrode 56 are electrically connected to each other.

In the configuration shown in FIG. 5, the silicon oxide films 54 and 58 may be dispensed with.

As is apparent from FIG. 5, the magnetic coupling type isolator according to an embodiment of the invention includes the upper and lower shield films 41 and 42 overlapped with the coil 2 and the magnetoresistive elements R1 to R4, and a middle shield film 43 disposed to surround the magnetoresistive elements R1 to R4. As described above, since the upper, lower, and middle shield films 41, 42, and 43 are provided around the magnetoresistive elements R1 to R4, it is possible to obtain a sufficient tolerance to an external magnetic field or an EMS.

It is preferable that the upper shield film has a function of enhancing the magnetic field received by the bridge circuit including the coil 2 and the magnetoresistive elements R1 to R4. In addition, it is preferable that the upper, lower, and middle shield films 41, 42, and 43 have a point-symmetric shape as seen in a top plan view, and their symmetric centers match with one another. In this configuration, it is possible to alleviate the difference of the midpoint electric potentials by more uniformly providing the magnitude of the magnetic field received by the magnetoresistive elements R1 to R4. The positional relationship or the sizes of the upper, lower, and middle shield films 41, 42, and 43 will be described later.

The effect of the magnetic coupling type isolator having the aforementioned configuration will be described.

Figure 7:
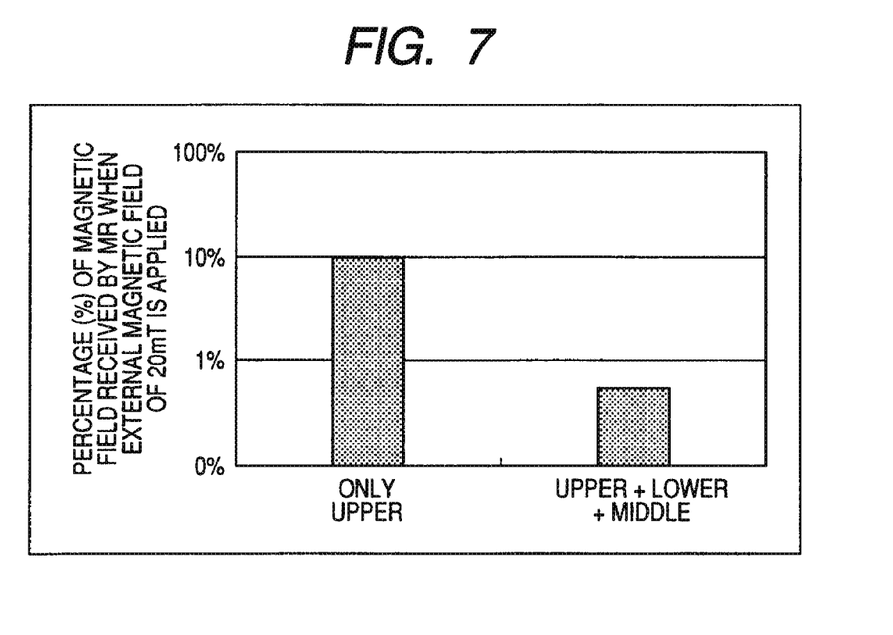
FIG. 7 shows a relationship between a configuration of a shield film of a magnetic coupling type isolator and a percentage of the magnetic field received by the magnetoresistive element when an external magnetic field is applied.

For the configuration shown in FIG. 5, i.e., the magnetic coupling type isolator including upper, lower, and middle shield films 41, 42, and 43 provided around the magnetoresistive elements R1 to R4 (the upper and lower shield films 41 and 42 have a square shape of 200 µm×200 µam, and the middle shield film 43 has a ring shape having an outer radius of 340 µm and an inner radius of 290 µm), the percentage of the magnetic field received by the magnetoresistive element was examined by applying an external magnetic field of 20 mT in a direction of the arrow of FIG. 5 (i.e., the horizontal direction with respect to the middle shield film 43). The result thereof is shown in FIG. 7. The result shows that the percentage of the magnetic field received by the magnetoresistive element when the external magnetic field is applied is nearly zero, which implies an excellent shield effect. For comparison purposes, another magnetic coupling type isolator having the same configuration as that shown in FIG. 5 except that only the upper shield film 41 is provided without the lower and middle shield films 42 and 43 was manufactured. Similarly, the percentage of the magnetic field received by the magnetoresistive element when the external magnetic field is applied was examined. The result is shown in FIG. 7.

As is apparent from FIG. 7, in the magnetic coupling type isolator having the upper, lower, and middle shield films 41, 42, and 43 provided around the magnetoresistive elements R1 to R4, the percentage of the magnetic field received by the magnetoresistive element when an external magnetic field is applied was 1% or less, which shows an excellent shield effect. Meanwhile, for a magnetic coupling type isolator having only the upper shield film 41, the percentage of the magnetic field received by the magnetoresistive element when an external magnetic field is applied was 10%, which implies a poor shield effect.

Embodiment 2

Figure 8:
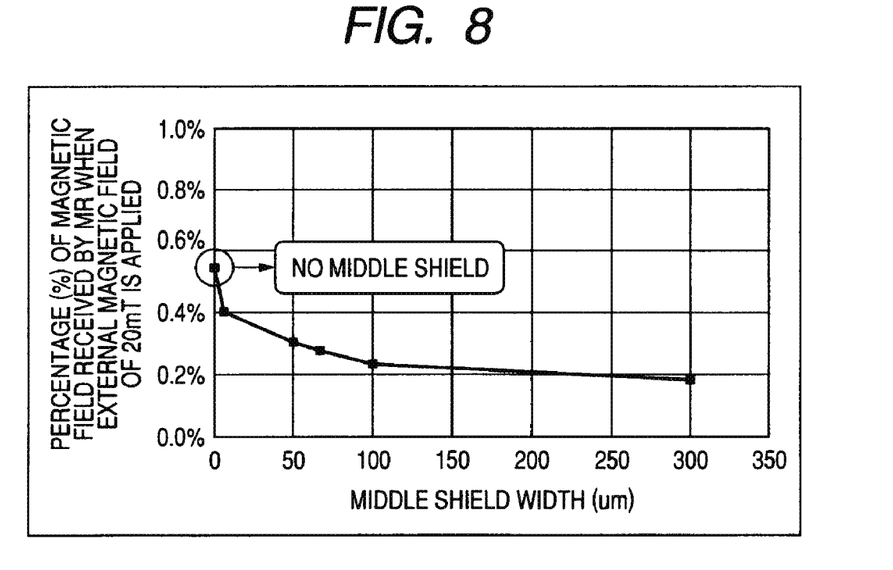
FIG. 8 shows a relationship between a width of a middle shield film in a magnetic coupling type isolator and a percentage of the magnetic field received by the magnetoresistive element when an external magnetic field is applied.

In this embodiment of the invention, a case where the width of the middle shield film 43 is specified will be described. In this case, the middle shield film 43 has a ring shape as seen in a top plan view, and the width and the shield effect thereof were examined. In other words, in the configuration having the upper, lower, and middle shield films 41, 42, and 43 provided around the magnetoresistive elements R1 to R4, a percentage of the magnetic field received by the magnetoresistive element was examined in a case where an external magnetic field of 20 mT is applied to the magnetic coupling type isolator in a direction of the arrow of FIG. 5 (i.e., the horizontal direction with respect to the middle shield film 43) by changing the width of the middle shield film 43 as seen in a top plan view. The result is shown in FIG. 8. For a comparison purpose, another magnetic coupling type isolator having the same configuration as that of FIG. 5 except that the upper and lower shield films 41 and 42 are provided without the middle shield film 43 was manufactured. Similarly, a percentage of the magnetic field received by the magnetoresistive element when an external magnetic field is applied was examined The result is shown in FIG. 8. In addition, the upper and lower shield films have a square shape of 200 µm×200 µm. The middle shield film has a ring shape having an inner radius of 290 µm, and its outer radius was changed.

In FIG. 8, it is recognized that, as the width of the middle shield film 43 increases, the shield effect increases, and particularly, abruptly increases from 10 µm. In addition, it is possible to reduce the chip size significantly. In other words, considering the number of components within the wafer, the width of the middle shield film 43 is preferably smaller than 300 µm. For this reason, the width of the middle shield film 43 is preferably set to be equal to or larger than 10 µm, and more preferably, 10 to 300 µm.

Embodiment 3

Figure 9A:
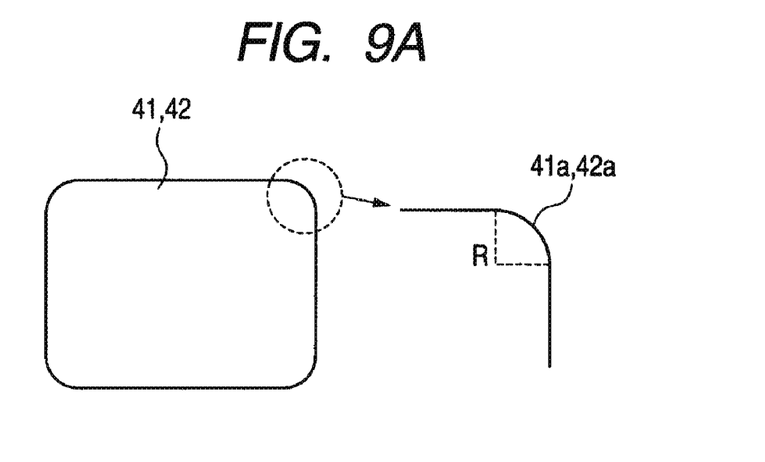
FIGS. 9A to 9C show configurations of an upper shield film and a lower shield film of a magnetic coupling type isolator.

In this embodiment of the invention, a case where the shapes of the upper and/or lower shield film are specified will be described. As shown in FIG. 9A, it is more preferable that the upper and/or lower shield films 41 and/or 42 have a shape 41a or 42a having a curvature R at the corner portions in comparison with a rectangular shape in terms of the shield effect. In other words, it is preferable that the upper and/or lower shield films 41 and 42 have a circular or elliptical shape as seen in a top plan view, or an n-polygonal shape (n=4 to ∞) having a curvature at the corner portions as seen in a top plan view.

Figure 9B:
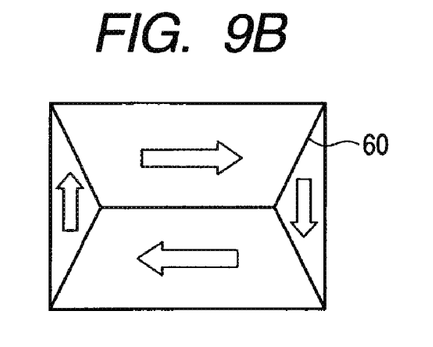
Figure 9C:
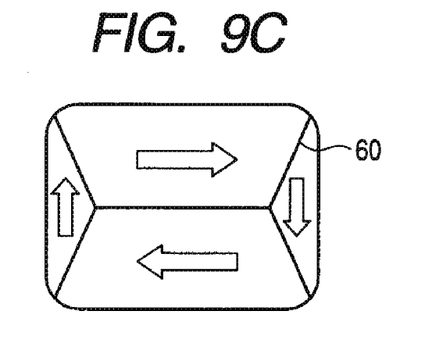

In comparison with the shape having the corner portions shown in FIG. 9B, the shape having the curvature in the corner portions shown in FIG. 9C is more advantageous to increase the magnetic permeability and improve the shield effect because the volume of the magnetic domain generated within the shield film can be reduced, and the magnetic domain displacement caused by the fluctuation in the external magnetic field can be smoother. Since it is anticipated that this effect becomes significant as the thickness of the shield film increases, the curvature is preferably set to be equal to or larger than ten times of the film thickness.

Figure 10:
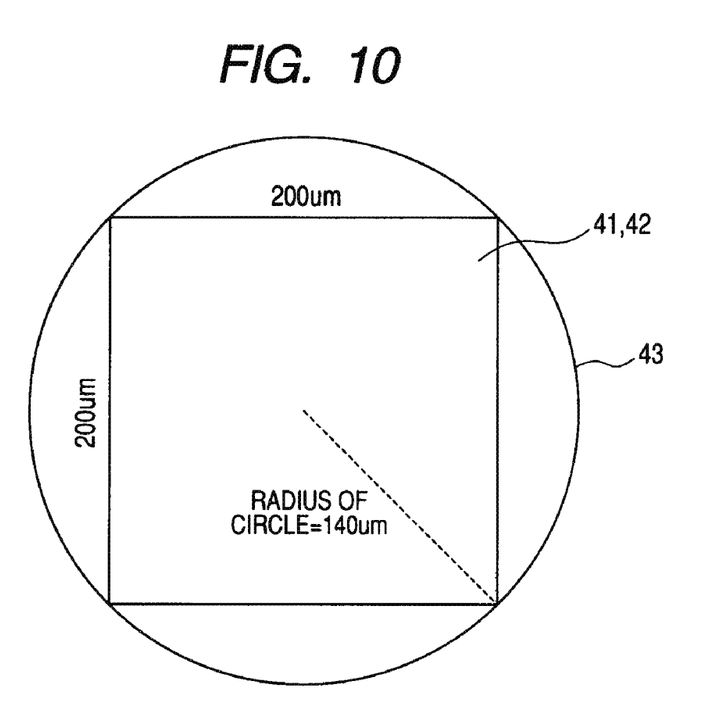
FIG. 10 shows a plan view of configurations of an upper shield film and a lower shield film of a magnetic coupling type isolator.
Figure 11:
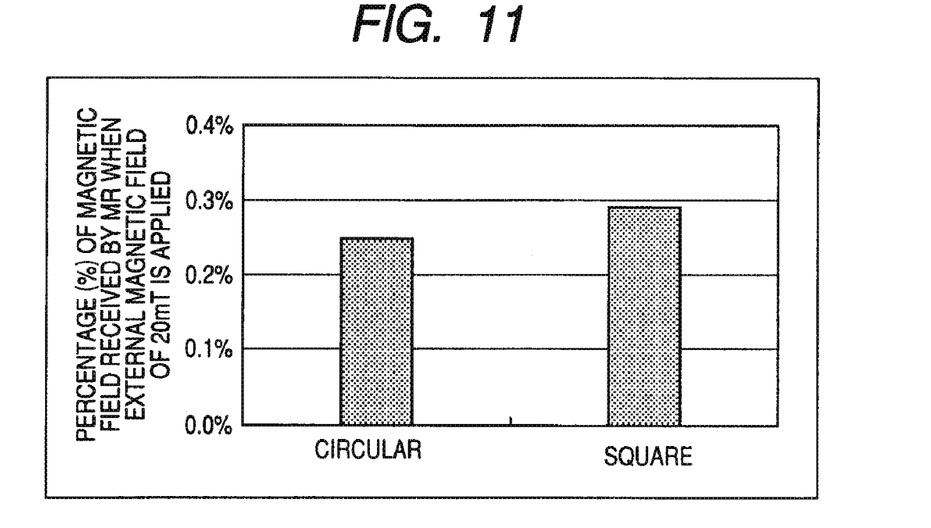
FIG. 11 shows a relationship between radiuses of an upper shield film and a lower shield film of a magnetic coupling type isolator and a percentage of the magnetic field received by the magnetoresistive element when an external magnetic field is applied.

Here, a difference of the shield effect between the shapes of the upper and lower shield films 41 and 42 was examined. Specifically, as shown in FIG. 10, a percentage of the magnetic field received by the magnetoresistive element was examined in a case where an external magnetic field of 20 mT is applied, in a direction of the arrow of FIG. 5 (i.e., the horizontal direction with respect to the middle shield film 43), to the magnetic coupling type isolator including the middle shield film 43 having an inner radius of 290 µm, a width of 50 µm, and a thickness of 30 µm, and the upper and lower shield films 41 and 42 having a circular shape having a radius of 140 µm. The result is shown in FIG. 11. In addition, for a comparison purpose, as shown in FIG. 10, another magnetic coupling type isolator having the same configuration as that of FIG. 5 was manufactured except that the upper and lower shield films 41 and 42 have a square shape by setting a distance (corresponding to the radius of a circle) from the center to the corner portion to 140 µm. Similarly, the percentage of the magnetic field received by the magnetoresistive element when an external magnetic field is applied was examined. The result is shown in FIG. 11.

Figure 12:
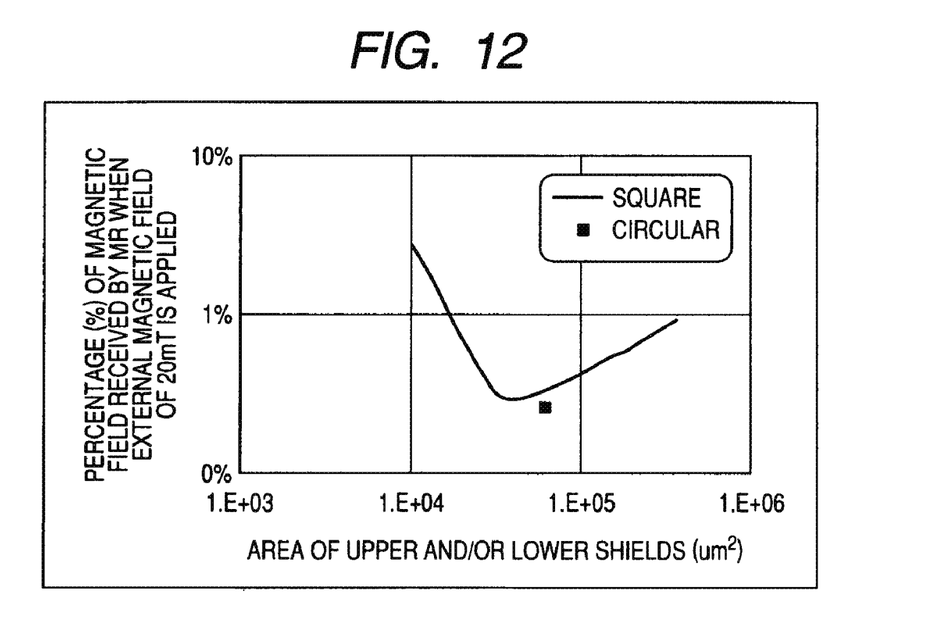
FIG. 12 shows a relationship between radiuses of an upper shield film and a lower shield film of a magnetic coupling type isolator and a percentage of the magnetic field received by the magnetoresistive element when an external magnetic field is applied.

As is apparent from FIG. 11, the shield effect is larger when the upper and lower shield films 41 and 42 have a circular shape. In addition, the shield effect was compared between a case where the upper and lower shield films 41 and 42 have a square shape and a case where they have a circular shape with the same area. The result is shown in FIG. 12. As is apparent from FIG. 12, even when they are compared with the same area, the shield effect in the circular shape was larger.

Embodiment 4

In this embodiment of the invention, a case where a relationship between the size of the upper and/or lower shield film and the size of the middle shield film is specified will be described. In this embodiment of the invention, the upper and/or lower shield films 41 and/or 42 are disposed in an inner side with respect to the outer periphery of the middle shield film 43. In other words, the sizes of the upper and/or lower shield films 41 and/or 42 are set to be smaller than the outer periphery of the middle shield film 43.

Here, a percentage of the magnetic field received by the magnetoresistive element was examined in a case where an external magnetic field of 20 mT is applied, in a direction of the arrow of FIG. 5 (i.e., the horizontal direction with respect to the middle shield film 43), to the magnetic coupling type isolator including the middle shield film 43 having an outer radius of 320 µm, a width of 50 µm, and a thickness of 30 µm by changing the sizes of the upper and/or lower shield films 41 and/or 42. The result is shown in FIG. 13.

Figure 13:
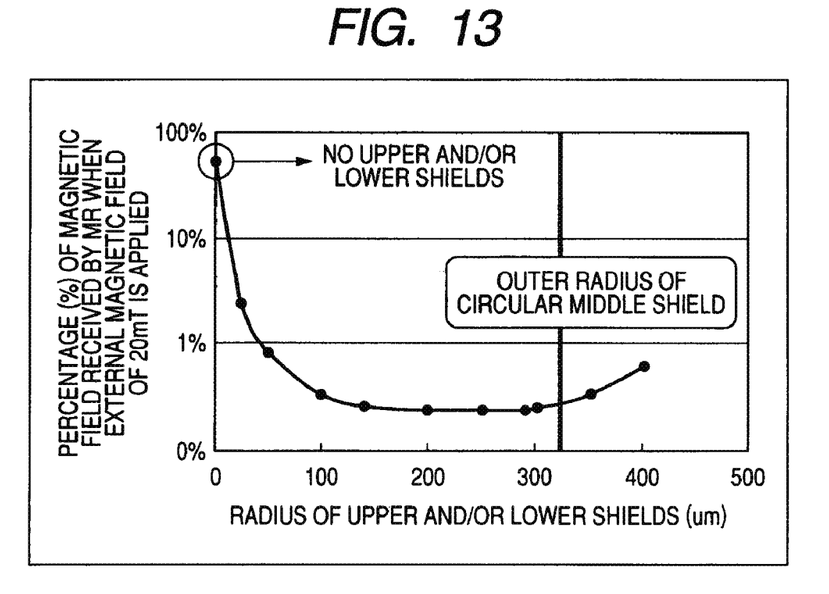
FIG. 13 shows a relationship between sizes of an upper shield film and a lower shield film of a magnetic coupling type isolator and a percentage of the magnetic field received by the magnetoresistive element when an external magnetic field is applied.

As is apparent from FIG. 13, if the sizes of the upper and/or lower shield films 41 and/or 42 are larger than the outer radius of the middle shield film 43, the shield effect is weakened. Therefore, it is possible to improve the shield effect further by setting the sizes of the upper and/or lower shield films 41 and/or 42 smaller than the size of the middle shield film 43.

Embodiment 5

In this embodiment of the invention, a case where the sizes of the upper and/or lower shield films are specified will be described. In this embodiment of the invention, the upper and/or lower shield films 41 and/or 42 are formed to have an area larger than the square shape of 100 µm×100 µm and smaller than the square shape of 600 µm×600 µm.

Here, a percentage of the magnetic field received by the magnetoresistive element was examined in a case where an external magnetic field of 20 mT is applied, in a direction of the arrow of FIG. 5 (i.e., the horizontal direction with respect to the middle shield film 43), to the magnetic coupling type isolator including the middle shield film 43 having an inner radius of 290 µm, a width of 50 µm, and a thickness of 30 µm by changing the length of one side of the square shape of the upper and/or lower shield films 41 and/or 42. The result is shown in FIG. 14.

Figure 14:
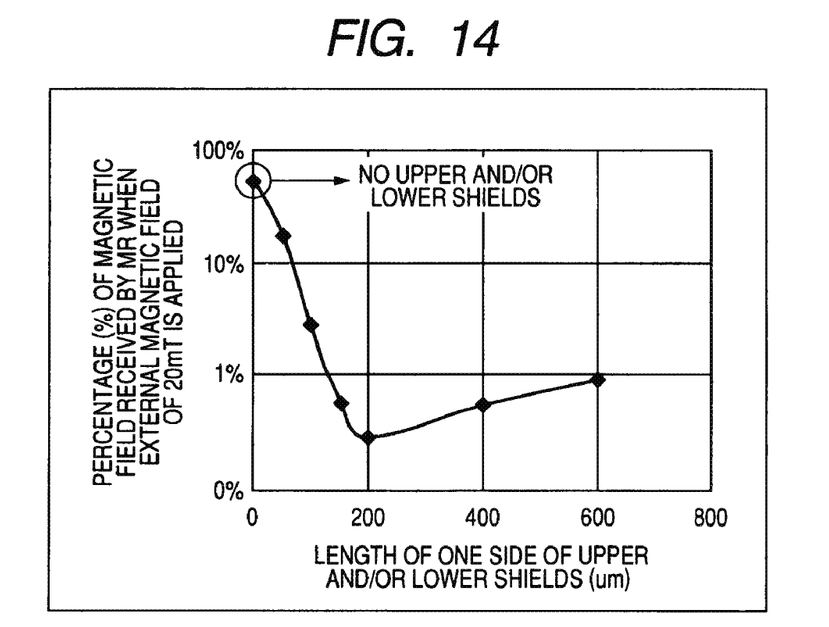
FIG. 14 shows a relationship between sizes of an upper shield film and a lower shield film of a magnetic coupling type isolator and a percentage of the magnetic field received by the magnetoresistive element when an external magnetic field is applied.

As is apparent from FIG. 14, as the sizes of the upper and/or lower shield films 41 and/or 42 are reduced, the shield effect increases, and particularly, becomes most significant near 200 µm.

In addition, a percentage of the magnetic field received by the magnetoresistive element was examined in a case where an external magnetic field of 20 mT is applied, in a direction of the arrow of FIG. 5 (i.e., the horizontal direction with respect to the middle shield film 43), to the magnetic coupling type isolator including the upper and/or lower shield films 41 and/or 42 without the middle shield film 43 by changing one length of the square shape of the upper and/or lower shield films 41 and/or 42. The result is shown in FIG. 15.

Figure 15:
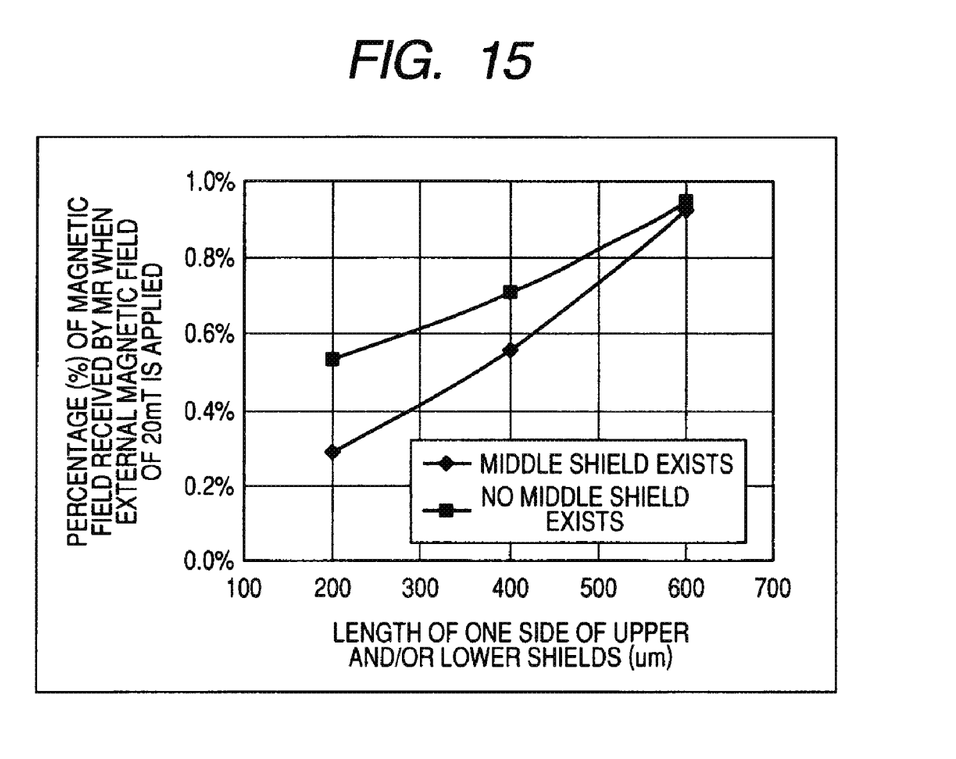
FIG. 15 shows a relationship between sizes of an upper shield film and a lower shield film of a magnetic coupling type isolator and a percentage of the magnetic field received by the magnetoresistive element when an external magnetic field is applied.

As is apparent from FIG. 15, as the length of one side of the square shape of the upper and/or lower shield films 41 and/or 42 is reduced, the effect of the middle shield film increases. In other words, as shown in FIG. 5, in a case where the middle shield film 43 is used in addition to the upper and lower shield films 41 and/or 42, it is preferable that the length of one side of the square shape of the upper and/or lower shield films 41 and/or 42 is small.

Based on the results of FIGS. 14 and 15, it is preferable that the upper and/or lower shield films 41 and/or 42 are formed to have an area larger than the square shape of 50 μm×50 μm. More preferably, they are smaller than the square shape of 600 μm×600 μm.

Figure 16:
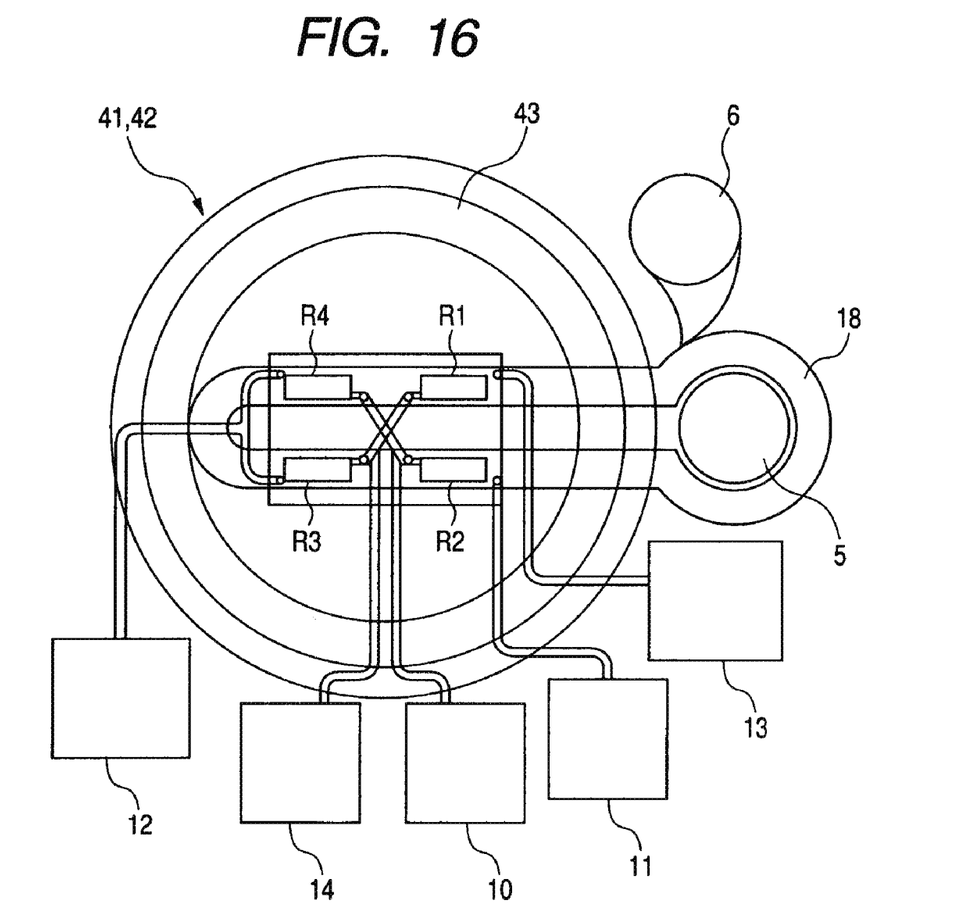
FIG. 16 shows a partial plan view shows another example of the magnetic coupling type isolator according to an embodiment of the invention.

The present invention may be embodied by properly combining the aforementioned embodiments 1 to 5. In addition, the present invention is not limited to the embodiments 1 to 5, but may be variously modified. For example, as shown in FIG. 16, the bridge circuit of the magnetoresistive element and the electrode pads 10 to 14 of the coil may be arranged to follow the outer periphery of the upper shield film 41. As a result, it is possible to reduce the chip size, increase the number of components in a single wafer, and reduce cost. In addition, since it is necessary to insulate the upper shield film 41 from the electrode pads 10 to 14, they are arranged not to be overlapped.

The material, the arrangement position of each layer, the thickness, the size, and the method of manufacturing of the embodiments 1 to 5 may be variously modified. In addition, the present invention may be variously modified without departing from the scope of the invention.

The present invention can be applied to an magnetic coupler, a current sensor, or the like.

It should be understood by those skilled in the art that various modifications, combinations, sub-combinations and alterations may occur depending on design requirements and other factors insofar as they are within the scope of the appended claims of the equivalents thereof.

What is claimed is:

1. A magnetic coupling type isolator comprising:
    a magnetic field generator for generating an external magnetic field by an input signal;
    a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view;
    first and second shield films overlapped with the magnetic field generator and the magnetoresistive element as seen in a top plan view; and
    a third shield film disposed to surround the magnetoresistive element.

2. The magnetic coupling type isolator according to claim 1, wherein the third shield film has a ring shape as seen in a top plan view and a width of 10 to 300 μm.

3. The magnetic coupling type isolator according to claim 1, wherein the first and/or second shield films have a circular or elliptical shape as seen in a top plan view.

4. The magnetic coupling type isolator according to claim 1, wherein the first and/or second shield films have an n-polygonal shape (n=4 to ∞) as seen in a plan view, of which corner portions have a curvature ten or more times of a film thickness.

5. The magnetic coupling type isolator according to claim 1, wherein the first and/or second shield films are disposed in an inner side with respect to an outer circumference of the third shield film.

6. The magnetic coupling type isolator according to claim 5, wherein the first and/or second shield films are formed to have an area larger than a square shape of 100 μm×100 μm and smaller than a square shape of 600 μm×600 μm.

7. The magnetic coupling type isolator according to claim 1,
    wherein the magnetic field generator includes first and second magnetic field generators by which the external magnetic field is generated in an opposite direction to each other,
    wherein the magnetoresistive element includes a magnetoresistive element disposed to face the first magnetic field generator and a magnetoresistive element disposed to face the second magnetic field generator which are included in the same layer, and
    wherein the magnetoresistive element disposed to face the first magnetic field generator and the magnetoresistive element disposed to face the second magnetic field generator constitute a bridge circuit.

8. The magnetic coupling type isolator according to claim 7, wherein the first shield film has a function of enhancing the magnetic field applied from the magnetic field generator to the bridge circuit.

9. The magnetic coupling type isolator according to claim 1, wherein the first, second, and/or third shield films are made of a high magnetic permeability material.

10. The magnetic coupling type isolator according to claim 1, wherein the first, second, and/or third shield films are point-symmetrical as seen in a top plan view, and the symmetrical centers of the first, second, and/or third shield films match with one another.

* * * * *